United States Patent
Nakayama et al.

(10) Patent No.: US 8,711,629 B2
(45) Date of Patent: Apr. 29, 2014

(54) NONVOLATILE SEMICONDUCTOR MEMORY DEVICE

(75) Inventors: Masayoshi Nakayama, Kyoto (JP); Takashi Ono, Osaka (JP); Reiji Mochida, Osaka (JP)

(73) Assignee: Panasonic Corporation, Osaka (JP)

( * ) Notice: Subject to any disclaimer, the term of this patent is extended or adjusted under 35 U.S.C. 154(b) by 68 days.

(21) Appl. No.: 13/608,587

(22) Filed: Sep. 10, 2012

(65) Prior Publication Data

US 2013/0003463 A1    Jan. 3, 2013

Related U.S. Application Data

(63) Continuation of application No. PCT/JP2011/000360, filed on Jan. 24, 2011.

(30) Foreign Application Priority Data

Mar. 10, 2010   (JP) .................................. 2010-053247

(51) Int. Cl.
  *G11C 16/24*   (2006.01)

(52) U.S. Cl.
  USPC .................................. 365/185.16; 365/185.23

(58) Field of Classification Search
  CPC ........... G11C 16/0466; G11C 16/0475; G11C 16/0491; G11C 16/24
  USPC ............. 365/189.09, 189.11, 230.06, 185.23, 365/185.16
  See application file for complete search history.

(56) References Cited

U.S. PATENT DOCUMENTS

| | | | |
|---|---|---|---|
| 5,448,518 | A | 9/1995 | Jinbo |
| 5,768,192 | A | 6/1998 | Eitan |
| 7,564,726 | B2 * | 7/2009 | Kouno ...................... 365/189.15 |
| 7,701,778 | B2 * | 4/2010 | Ajika et al. .............. 365/185.22 |
| 8,013,378 | B2 * | 9/2011 | Takahashi ...................... 257/311 |
| 2003/0011024 | A1 | 1/2003 | Nishioka |
| 2003/0072193 | A1 | 4/2003 | Kamei et al. |
| 2007/0183211 | A1 | 8/2007 | Yano et al. |
| 2009/0109757 | A1 | 4/2009 | Yano et al. |
| 2009/0245002 | A1 | 10/2009 | Matsui et al. |
| 2012/0044759 | A1 * | 2/2012 | Takahashi ...................... 365/184 |
| 2012/0044760 | A1 * | 2/2012 | Takahashi ...................... 365/184 |

FOREIGN PATENT DOCUMENTS

| | | |
|---|---|---|
| JP | 07-057487 A | 3/1995 |
| JP | 2002-367387 A | 12/2002 |
| WO | WO-2009/075832 A1 | 6/2009 |

OTHER PUBLICATIONS

International Search Report mailed Apr. 5, 2011 issued in corresponding International Application No. PCT/JP2011/000360.

\* cited by examiner

*Primary Examiner* — Douglas King

(74) *Attorney, Agent, or Firm* — McDermott Will & Emery LLP

(57) ABSTRACT

Bit lines connected to each nonvolatile memory cell are selected by corresponding selective transistors. A first drive circuit for driving the gate of one of the selective transistors receives a voltage selected by a first voltage switch, and a second drive circuit for driving the gate of the other selective transistor receives a voltage selected by a second voltage switch. A transistor constituting the first drive circuit is different in structure from a transistor constituting the second drive circuit.

10 Claims, 5 Drawing Sheets

FIG.2

|  | VSELa | VSELb | VWL | CSa_1 | SLa_0 | CSb_0 | SLb_1 | WL1 | BLa_2 | BLb_1 |
|---|---|---|---|---|---|---|---|---|---|---|
| Read | 3V | 3V | 5V | 3V | 3V | 3V | 3V | 5V | 1V | 0V |
| Program | 5V | 10V | 9V | 5V | 5V | 10V | 10V | 9V | 0V | 5V |
| Erase | 5V | 10V | -5V | 0V | 5V | 10V | 10V | -5V | HiZ | 5V |

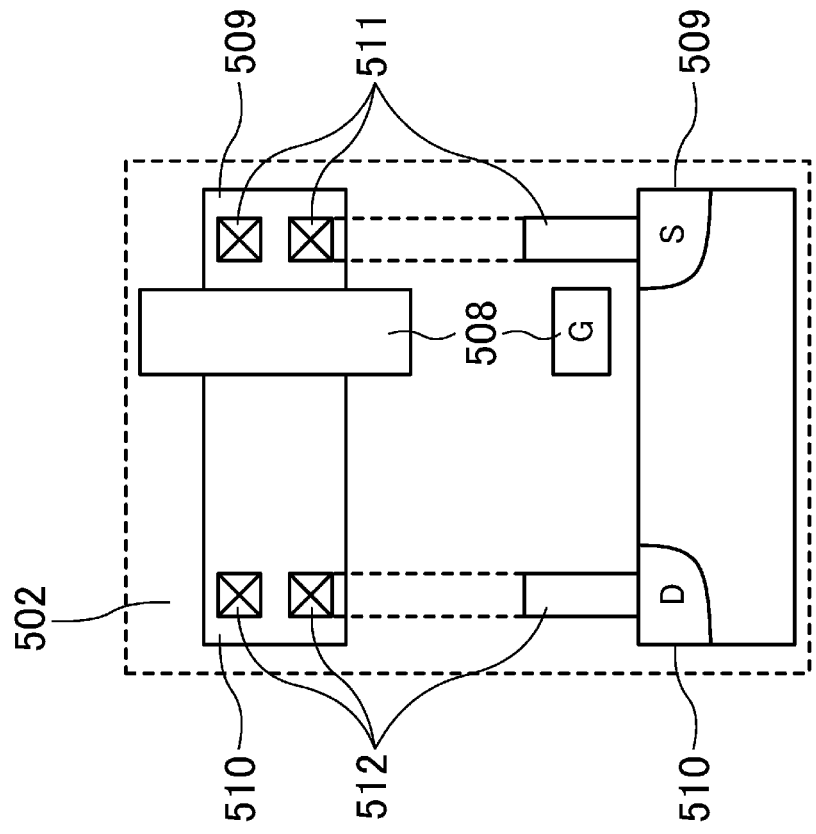
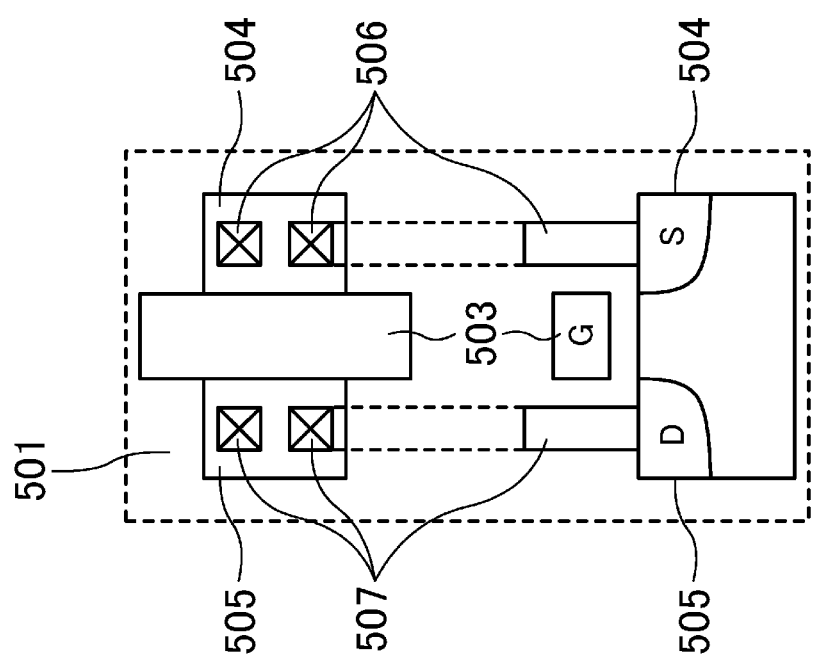

NONVOLATILE SEMICONDUCTOR MEMORY DEVICE

CROSS-REFERENCE TO RELATED APPLICATION

This is a continuation of PCT International Application PCT/JP2011/000360 filed on Jan. 24, 2011, which claims priority to Japanese Patent Application No. 2010-053247 filed on Mar. 10, 2010. The disclosures of these applications including the specifications, the drawings, and the claims are hereby incorporated by reference in their entirety.

BACKGROUND

The present disclosure relates to a nonvolatile semiconductor memory device having a memory array in which nonvolatile memory cells are arranged using a virtual ground.

Flash electrically erasable nonvolatile semiconductor memory devices have a feature that stored information is not lost even in a power-off state. Various methods have been proposed on how to form an array of memory cells in a nonvolatile semiconductor memory device. Among such methods, there is a method where metal oxide nitride oxide silicon (MONOS) memory cells that store information by local injection of charge are arranged using a virtual ground, to constitute a memory array. This method has recently attracted attention because it is advantageous in reducing the layout area and is simple in structure and thus easy in fabrication.

In MONOS memory cells, two-bit information can be stored in one memory cell by injecting charge locally into portions of a MONOS film near two bit lines connected to the memory cell (see U.S. Pat. No. 5,768,192).

FIG. 4 is a cross-sectional view showing a configuration of a MONOS memory cell. The MONOS memory cell shown in FIG. 4 includes a gate 401 connected to a word line, n-type diffusion layers 402 and 403 connected to bit lines, and a thin film 404 of a MONOS structure placed between the gate 401 and a p-type substrate 407. The reference characters A1 and A2 respectively denote charge injection areas as portions of the MONOS thin film 404 near the diffusion layers 402 and 403, into which charge is injected for storing information.

The memory cell of FIG. 4 can store two-bit information using the charge injection areas A1 and A2. The program operation of injecting charge into the charge injection area A1 near the diffusion layer 402 is performed in the following manner, for example. A voltage of 9 V is applied to the gate 401 of the memory cell via the word line, 5 V is applied to the diffusion layer 402 via the first bit line, and the diffusion layer 403 is fixed at the ground potential via the second bit line. With this voltage application, hot electrons generated by a current flowing through the channel are injected into the charge injection area A1. Similarly, the program operation of injecting charge into the charge injection area A2 near the diffusion layer 403 is performed, for example, by applying 9 V to the gate 401, fixing the diffusion layer 402 at the ground potential, and applying 5 V to the diffusion layer 403. In other words, the voltage states of the diffusion layers 402 and 403 are interchanged with each other. In this way, hot electrons generated by a current flowing through the channel is injected into the charge injection area A2.

SUMMARY

Selective transistors for the first and second bit lines respectively connected to the diffusion layers 402 and 403 in FIG. 4 will be described.

To apply 5 V to the diffusion layers, it is necessary to drive the selective transistors for the bit lines at a voltage as high as about 10 V considering a back-bias effect. By contrast, to fix the diffusion layers at the ground potential, about 5 V is enough as the drive voltage for the selective transistors for the bit lines. However, for storing two-bit information in one memory cell, the program operation must be performed by interchanging the voltage states of the diffusion layers 402 and 403 as described above. Therefore, the selective transistors for both the first and second bit lines connected to the memory cell must be configured to be bearable to driving at a voltage as high as about 10 V. In other words, drive circuits for the selective transistors for both the first and second bit lines must be formed using transistors having high voltage tolerance.

Incidentally, when a memory is meant for a high-reliability use, it is more advantageous to use the memory in the form of storing one-bit information in one memory cell. The reason is that, when two-bit information is stored in one memory cell, the probability of occurrence of erroneous read is high, compared with the case of storing one-bit information, due to decrease in Vt difference between the "0" state and the "1" state and increase in Vt deterioration amount caused by retention, etc.

When one-bit information is stored in one memory cell, it is unnecessary to interchange the voltage states of the diffusion layers 402 and 403 in the program operation. For example, when only the charge injection area A1 is used, the program operation may just be performed by applying 9 V to the gate 401, applying 5 V to the diffusion layer 402, and fixing the diffusion layer 403 at the ground potential. In other words, while the selective transistor for the bit line connected to the diffusion layer 402 is driven at a voltage as high as about 10 V, the selective transistor for the bit line connected to the diffusion layer 403 may just be driven at about 5 V. This permits use of a transistor low in voltage tolerance for the drive circuit for the selective transistor for the bit line connected to the diffusion layer 403.

In general, the voltage tolerance of a transistor can be improved by increasing the thickness of a gate oxide film, increasing the distance between the gate and a drain contact, and increasing the gate length. These measures however necessitate increasing the layout area and also increasing the gate width due to decrease in transistor capability. Thus, the circuit area is smaller with use of a transistor lower in voltage tolerance.

It is an objective of the present disclosure to provide a nonvolatile semiconductor memory device having nonvolatile memory cells arranged using a virtual ground, where drive circuits for bit-line selective transistors are reduced to make the circuit area smaller.

In one embodiment of the present invention, the nonvolatile semiconductor memory device includes: a memory array having a plurality of nonvolatile memory cells arranged using a virtual ground, a word line for control of a gate and first and second bit lines being connected to each of the nonvolatile memory cells; a first selective transistor group for selecting the first bit line; a first selective transistor drive circuit configured to drive gates of the first selective transistor group; a second selective transistor group for selecting the second bit line; a second selective transistor drive circuit configured to drive gates of the second selective transistor group; a first voltage switch configured to select a voltage to be supplied to the first selective transistor drive circuit depending on the operation of the memory array; and a second voltage switch configured to select a voltage to be supplied to the second selective transistor drive circuit depending on the operation of the memory array, wherein a transistor constituting the first selective transistor drive circuit is different in structure from a transistor constituting the second selective transistor drive circuit.

In the above embodiment, the first and second bit lines connected to each of the nonvolatile memory cells are respectively selected by the first selective transistor group and the second selective transistor group. The first selective transistor drive circuit for driving the gates of the first selective transistor group receives a voltage selected by the first voltage switch, and the second selective transistor drive circuit for driving the gates of the second selective transistor group receives a voltage selected by the second voltage switch. In other words, the voltages supplied to the first and second selective transistor drive circuits can be selected independently. Therefore, when the nonvolatile memory cell is used for storing one-bit information, the voltages for driving the gates of the first and second selective transistor groups can be independently set at appropriate values. This permits use of transistors lower in voltage tolerance for one of the first and second selective transistor drive circuits than those for the other. That is, the area of the selective transistor drive circuit can be made smaller, and thus a nonvolatile semiconductor memory device with a reduced circuit area can be implemented.

According to the present disclosure, in which a drive circuit for bit line selective transistors can be reduced, a nonvolatile semiconductor memory device with a reduced circuit area can be implemented.

BRIEF DESCRIPTION OF THE DRAWINGS

FIG. 2 is a view showing an example of voltage states during the operations of the device of FIG. 1.

FIGS. 5A and 5B are views showing example structures of transistors different in the distance between the gate and the drain contacts.

DETAILED DESCRIPTION

Embodiments of the present invention will be described hereinafter with reference to the accompanying drawings.

First Embodiment

Figure 1:
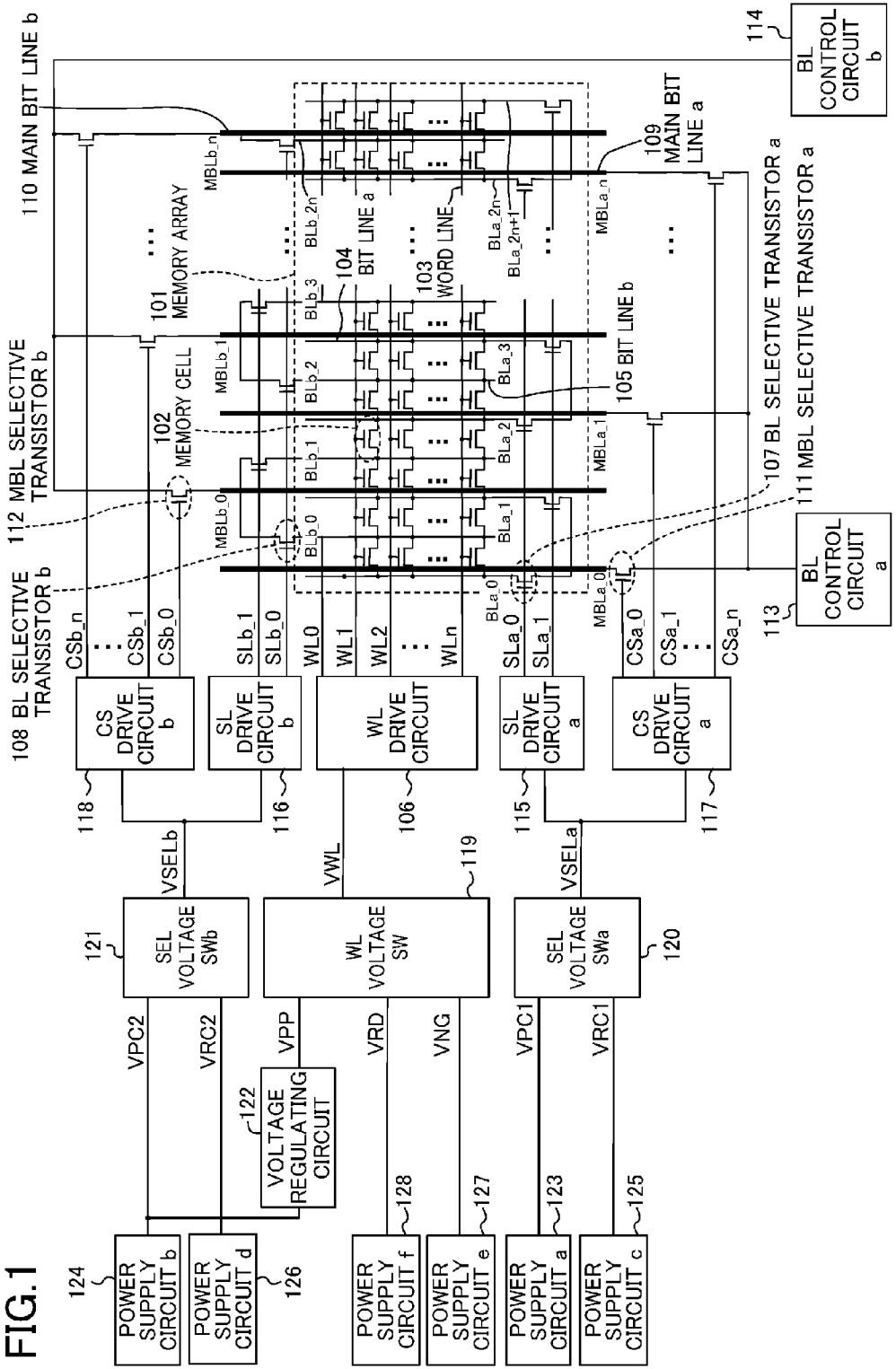
FIG. 1 is a view showing a configuration of a nonvolatile semiconductor memory device of the first embodiment.

FIG. 1 is a view showing a configuration of a nonvolatile semiconductor memory device of the first embodiment. In FIG. 1, a memory array 101 includes: a plurality of nonvolatile memory cells 102 arranged in the X and Y directions into an array; a plurality of word lines 103 (WL0 to WLn) extending in the X direction in the region of arrangement of the memory cells 102; and a plurality of bit lines a 104 (BLa__0 to BLa__2n+1) as the first bit lines and a plurality of bit lines b 105 (BLb__0 to BLb__2n) as the second bit lines extending in the Y direction in the region of arrangement of the memory cells 102. The memory cells 102, the word lines 103, the bit lines a 104, and the bit lines b 105 are arranged using a virtual ground.

It is herein assumed that the memory cells 102 are metal oxide nitride oxide silicon (MONOS) memory cells that store information by local injection of charge. To each of the memory cells 102, connected are the word line 103 for control of the gate, the bit line a 104, and the bit line b 105. Information is stored in the memory cell 102 by injecting charge locally into a portion of the memory cell 102 near the bit line b 105 out of the two bit lines a 104 and b 105 connected to the memory cell 102.

The word lines 103 are connected to a word line (WL) drive circuit 106.

The bit lines a 104 are connected to main bit lines a 109 (MBLa__0 to MBLa_n) via bit line (BL) selective transistors a 107, and the main bit lines a 109 are connected to a BL control circuit a 113 via main bit line (MBL) selective transistors a 111. Similarly, the bit lines b 105 are connected to main bit lines b 110 (MBLb__0 to MBLb_n) via BL selective transistors b 108, and the main bit lines b 110 are connected to a BL control circuit b 114 via MBL selective transistors b 112. The BL selective transistors a 107 and the MBL selective transistors a 111 constitute a first selective transistor group, and the BL selective transistors b 108 and the MBL selective transistors b 112 constitute a second selective transistor group.

The gates of the BL selective transistors a 107 (SLa__0, SLa__1) are connected to a SL drive circuit a 115, and the gates of the MBL selective transistors a 111 (CSa__0 to CSa_n) are connected to a CS drive circuit a 117. Similarly, the gates of the BL selective transistors b 108 (SLb__0, SLb__1) are connected to a SL drive circuit b 116, and the gates of the MBL selective transistors b 112 (CSb__0 to CSb_n) are connected to a CS drive circuit b 118. The SL drive circuit a 115 and the CS drive circuit a 117 constitute a first selective transistor drive circuit that drives the gates of the first selective transistor group, and the SL drive circuit b 116 and the CS drive circuit b 118 constitute a second selective transistor drive circuit that drives the gates of the second selective transistor group.

A WL voltage switch 119 is connected to the WL drive circuit 106 as a drive power supply (voltage VWL). The WL voltage switch 119 switches the voltage to be supplied to the WL drive circuit 106 among a voltage VPP supplied from a power supply circuit b 124 via a voltage regulating circuit 122, a voltage VRD supplied from a power supply circuit f 128, and a voltage VNG supplied from a power supply circuit e 127 depending on the operation state of the memory array 101.

A SEL voltage switch a 120 is connected to the SL drive circuit a 115 and the CS drive circuit a 117 as a drive power supply (voltage VSELa). The SEL voltage switch a 120 switches the voltage to be supplied to these circuits between a voltage VPC1 supplied from a power supply circuit a 123 and a voltage VRC1 supplied from a power supply circuit c 125 depending on the operation state of the memory array 101. Similarly, a SEL voltage switch b 121 is connected to the SL drive circuit b 116 and the CS drive circuit b 118 as a drive power supply (voltage VSELb). The SEL voltage switch b 121 switches the voltage to be supplied to these circuits between a voltage VPC2 supplied from the power supply circuit b 124 and a voltage VRC2 supplied from a power supply circuit d 126 depending on the operation state of the memory array 101.

The read, program, and erase operations of the nonvolatile semiconductor memory device of FIG. 1 will be described with reference to FIG. 2. FIG. 2 shows an example of the voltage values at various positions used when the read, program, and erase operations are performed, where VSELa, VSELb, and VWL are respectively supply voltages from the SEL voltage switch a 120, the SEL voltage switch b 121, and the WL voltage switch 119, CSa__1, SLa__0, CSb__0, and SLb_1 are respectively gate drive voltages for the MBL selective transistors a 111, the BL selective transistors a 107, the MBL selective transistors b 112, and the BL selective transistors b 108, WL1 is a voltage of the word lines 103, and BLa_2 and BLb_1 are respectively voltages of the bit lines a 104 and the bit lines b 105.

The read operation for the memory cell 102 is performed in the following manner.

The WL voltage switch 119 selects the voltage VRD (5 V) supplied from the power supply circuit f 128, and supplies the voltage as the power supply voltage VWL for the WL drive circuit 106. The SEL voltage switch a 120 selects the voltage VRC1 (3 V) supplied from the power supply circuit c 125, and supplies the voltage as the power supply voltage VSELa for the SL drive circuit a 115 and the CS drive circuit a 117. The SEL voltage switch b 121 selects the voltage VRC2 (3 V) supplied from the power supply circuit d 126, and supplies the voltage as the power supply voltage VSELb for the SL drive circuit b 116 and the CS drive circuit b 118.

The BL control circuit a 113 supplies a drain voltage (1 V) for reading, and the BL control circuit b 114 supplies the ground potential as the source voltage for reading.

After the execution of the voltage switch operation and the voltage supply operation as described above, the WL drive circuit 106 drives the word line WL1 at the voltage VRD (5 V). Also, the SL drive circuit a 115 drives the gates SLa_0, and the CS drive circuit a 117 drives the gate CSa_1, at the voltage VSELa (=VRC1 (3 V)). Similarly, the SL drive circuit b 116 drives the gates SLb_1, and the CS drive circuit b 118 drives the gate CSb_0, at the voltage VSELb (=VRC2 (3 V)).

By the selection and setting of the voltage states as described above, the bit line BLa_2 for the memory cell 102 is connected to the BL control circuit a 113 to receive the supply voltage (1 V), and the bit line BLb_1 is connected to the BL control circuit b 114 to be set at the ground potential. In this state, information stored in the memory cell 102 can be read by detecting whether the current flowing through the channel of the memory cell 102 is large or small, which depends on the presence/absence of charge injected in a portion of the memory cell 102 near the bit line BLb_1.

The program operation for the memory cell 102 is performed in the following manner.

The WL voltage switch 119 selects the voltage VPP (9 V) supplied from the power supply circuit b 124 via the voltage regulating circuit 122, and supplies the voltage as the power supply voltage VWL for the WL drive circuit 106. The SEL voltage switch a 120 selects the voltage VPC1 (5 V) supplied from the power supply circuit a 123, and supplies the voltage as the power supply voltage VSELa for the SL drive circuit a 115 and the CS drive circuit a 117. The SEL voltage switch b 121 selects the voltage VPC2 (10 V) supplied from the power supply circuit b 124, and supplies the voltage as the power supply voltage VSELb for the SL drive circuit b 116 and the CS drive circuit b 118.

The BL control circuit a 113 supplies the ground potential as the source voltage for programming, and the BL control circuit b 114 supplies 5 V or more as the voltage considering a voltage drop at the BL selective transistor b 108 and the MBL selective transistor b 112 to ensure application of 5 V to the bit line b 104 as the drain voltage for programming.

After the execution of the voltage switch operation and the voltage supply operation as described above, the WL drive circuit 106 drives the word line WL1 at the voltage VPP (9 V). Also, the SL drive circuit a 115 drives the gates SLa_0, and the CS drive circuit a 117 drives the gates CSa_1, at the voltage VSELa (=VPC1 (5 V)). Similarly, the SL drive circuit b 116 drives the gates SLb_1, and the CS drive circuit b 118 drives the gate CSb_0, at the voltage VSELb (=VPC2 (10 V)).

By the selection and setting of the voltage states as described above, the bit line BLa_2 for the memory cell 102 is connected to the BL control circuit a 113 to be set at the ground potential, and the bit line BLb_1 is connected to the BL control circuit b 114 to receive 5 V. Thus, hot electrons generated from a current flowing through the channel of the memory cell 102 are injected into a portion of the memory cell 102 near the bit line BLb_1, whereby the program operation is performed.

Note that, while 5 V is applied to the bit line BLb_1, the bit line BLa_2 is at the ground potential and thus less influenced by a back bias. Therefore, the voltage at the gates SLa_0 and CSa_1 is low (5 V) compared with the voltage (10 V) at the gates SLb_1 and CSb_0. Note that, in order to secure the bit line BLa_2 sufficiently close to the ground potential, a high voltage (5 V) considering the fact that the current is large during programming is selected and applied, compared with the gate voltage (3 V) for reading.

The erase operation for the memory cell 102 is performed in the following manner.

The WL voltage switch 119 selects the voltage VNG (−5 V) supplied from the power supply circuit e 127, and supplies the voltage as the power supply voltage VWL for the WL drive circuit 106. The SEL voltage switch a 120 selects the voltage VPC1 (5 V) supplied from the power supply circuit a 123, and supplies the voltage as the power supply voltage VSELa for the SL drive circuit a 115 and the CS drive circuit a 117. The SEL voltage switch b 121 selects the voltage VPC2 (10 V) supplied from the power supply circuit b 124, and supplies the voltage as the power supply voltage VSELb for the SL drive circuit b 116 and the CS drive circuit b 118.

The BL control circuit a 113 supplies the ground potential, and the BL control circuit b 114 supplies 5 V or more as the voltage considering a voltage drop at the BL selective transistor b 108 and the MBL selective transistor b 112 to ensure application of 5 V to the bit line b 104 as the voltage for erasing.

After the execution of the voltage switch operation and the voltage supply operation as described above, the WL drive circuit 106 drives the word line WL1 at the voltage VNG (−5 V). Also, the SL drive circuit a 115 drives the gates SLa_0 at the voltage VSELa (=VPC1 (5 V)), but the CS drive circuit a 117 does not select any gate, setting all the gates CSa_0 to CSa_n at the ground potential. The SL drive circuit b 116 drives the gates SLb_1, and the CS drive circuit b 118 drives the gate CSb_0, at the voltage VSELb (=VPC2 (10 V)).

By the selection and setting of the voltage states as described above, the bit line BLa_2 for the memory cell 102 is in the HiZ state, and the bit line BLb_1 is connected to the BL control circuit b 114 to receive 5 V. Thus, holes generated by a band-to-band tunneling (BTBT) current flowing between the bit line BLb_1 for the memory cell 102 and the substrate neutralize the charge near the bit line BLb_1, whereby the erase operation is performed.

The erase operation may be performed for a plurality of memory cells at one time. This can be achieved by setting voltage states similar to those described above and setting the selection states of the WL drive circuit 106, the SL drive circuit a 115, the SL drive circuit b 116, the CS drive circuit a 117, and the CS drive circuit b 118 so that −5 V be applied to the word lines WL0 to WLn, 5V be applied to the bit lines BLb_0 to BLb_2n, and the bit lines BLa_0 to BLa_(2n+1) be in the HiZ state.

As described above, with the circuit configuration shown in FIG. 1, the largest voltage value used at the driving by the SL drive circuit a 115 and the CS drive circuit a 117 is 5 V, indicating that these circuits can operate at low voltage compared with 10 V used by at the driving by the SL drive circuit b 116 and the CS drive circuit b 118. Therefore, transistors having low voltage tolerance can be used as the transistors constituting the SL drive circuit a 115 and the CS drive circuit a 117. In other words, the transistors constituting the SL drive circuit a 115 and the CS drive circuit a 117 are different in structure from the transistors constituting the SL drive circuit b 116 and the CS drive circuit b 118. For example, they may be different in the thickness of the gate oxide film, in the distance between the gate and the drain contacts, or in the gate length. Having such a structure, the circuit areas of the SL drive circuit a 115 and the CS drive circuit a 117 can be reduced.

FIGS. 5A and 5B are views showing example structures of transistors different in the distance between the gate and the drain contacts from each other. In each of FIGS. 5A and 5B, the upper part shows a plan view and the lower part shows a cross-sectional view, where the reference character 501, 502 denotes a transistor, 503, 508 a gate, 504, 509 a source region, 505, 510 a drain region, 506, 511 source contacts, and 507, 512 drain contacts. In the transistor 502 shown in FIG. 5B, the distance between the gate 508 and the drain contacts 512 is longer than that in the transistor 501 shown in FIG. 5A. For example, the SL drive circuit a 115 and the CS drive circuit a 117 may each be constituted by the transistor 501 having the structure shown in FIG. 5A, and the SL drive circuit b 116 and the CS drive circuit b 118 may each be constituted by the transistor 502 having the structure shown in FIG. 5B. In addition to the difference in the distance between the gate and the drain contacts, the distance between the gate and the source contacts may be made different.

Note that, although the power supply circuit c 125 and the power supply circuit d 126 generate the same voltage (3 V) as an example in this embodiment, they may generate different voltages considering the characteristics of the memory cells.

Second Embodiment

Figure 3:
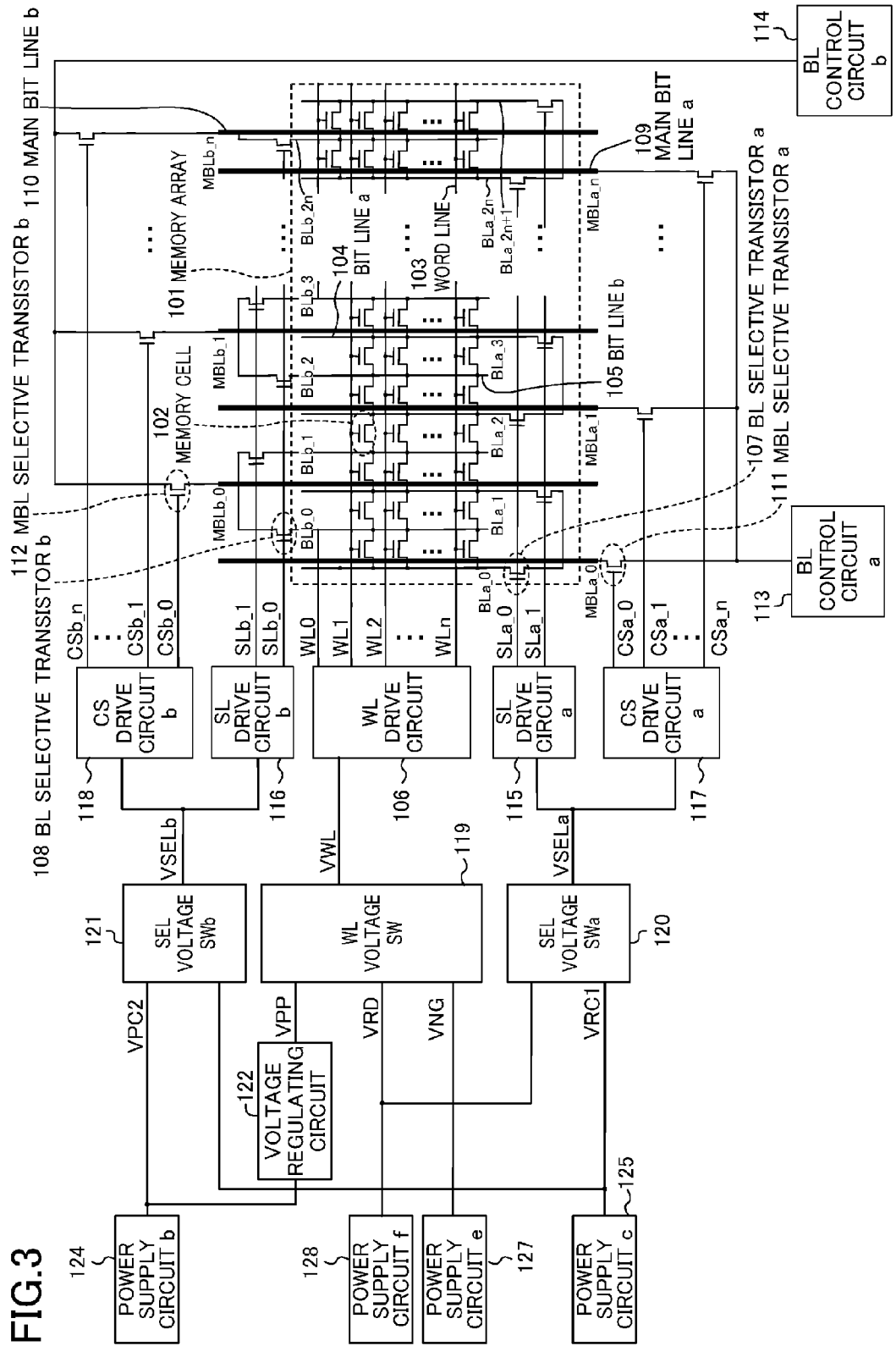
FIG. 3 is a view showing a configuration of a nonvolatile semiconductor memory device of the second embodiment.
Figure 4:
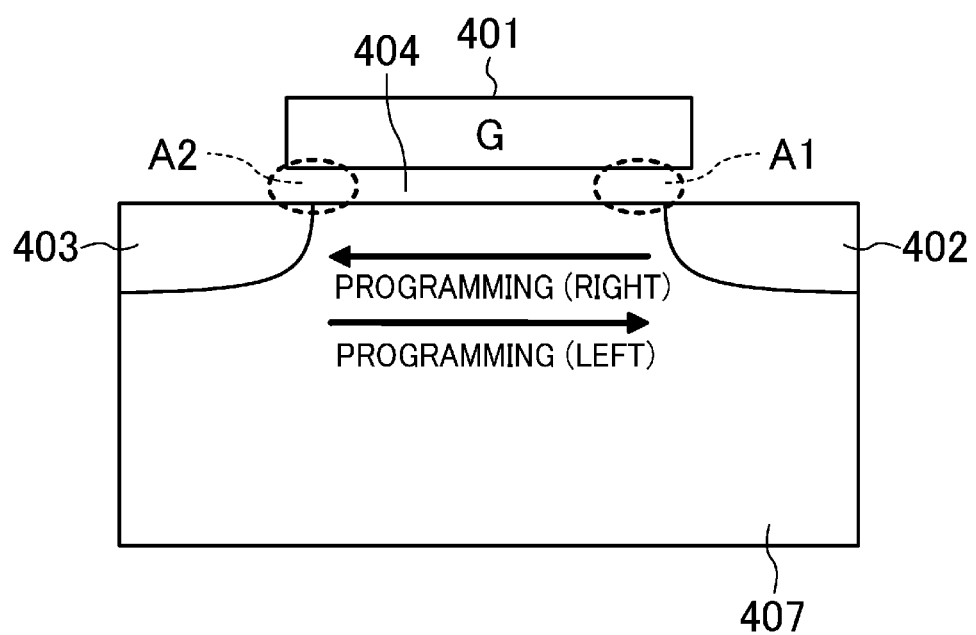
FIG. 4 is a view showing a configuration of a MONOS memory cell.

FIG. 3 is a view showing a configuration of a nonvolatile semiconductor memory device of the second embodiment. In FIG. 3, components common to those in FIG. 1 are denoted by the same reference characters, and detailed description of such components is omitted here.

In the configuration of FIG. 3, the kinds and connection of the power supply circuits for supplying voltages to the SEL voltage switch a 120 and the SEL voltage switch b 121 are different from those in FIG. 1. That is, while the SEL voltage switch a 120 receives the voltage VPC1 supplied from the power supply circuit a 123 and the voltage VRC1 supplied from the power supply circuit c 125 in the configuration of FIG. 1, the power supply circuit a 123 is omitted and the SEL voltage switch a 120 receives the voltage VRD supplied from the power supply circuit f 128 for the word line voltage for reading, in place of the voltage VPC1, in the configuration of FIG. 3. Also, while the SEL voltage switch b 121 receives the voltage VPC2 supplied from the power supply circuit b 124 and the voltage VRC2 supplied from the power supply circuit d 126 in the configuration of FIG. 1, the power supply circuit d 126 is omitted and the SEL voltage switch b 121 receives the voltage VRC1 supplied from the power supply circuit c 125, in place of the voltage VRC2, in the configuration of FIG. 3.

The other configuration is similar to that of FIG. 1. The read, program, and erase operations are also similar to those in the first embodiment, which are performed using the voltage values shown in FIG. 2, for example.

In the configuration of FIG. 3, during the program operation, the gate voltage for the BL selective transistors a 107 and the MBL selective transistors a 111 is restricted to the word line voltage for reading. Also, during the read operation, the gate voltages for the BL selective transistors a 107, the MBL selective transistor a 111, the BL selective transistor b 108, and the MBL selective transistor b 112 are forced to be the same. That is, the degree of freedom of the voltage application decreases compared with the configuration of FIG. 1. However, the number of power supply circuits can be reduced, permitting decrease of the area, compared with the configuration of FIG. 1.

According to the present disclosure, the drive circuits for the bit line selective transistors can be reduced, allowing implementation of a nonvolatile semiconductor memory device with a reduced circuit area. Thus, the present disclosure is advantageous in reduction of the size and cost of memory.

What is claimed is:

1. A nonvolatile semiconductor memory device, comprising:
    a memory array having a plurality of nonvolatile memory cells arranged using a virtual ground, a word line for control of a gate and first and second bit lines being connected to each of the nonvolatile memory cells;
    a first selective transistor group for selecting the first bit line;
    a first selective transistor drive circuit configured to drive gates of the first selective transistor group;
    a second selective transistor group for selecting the second bit line;
    a second selective transistor drive circuit configured to drive gates of the second selective transistor group;
    a first voltage switch configured to select a voltage to be supplied to the first selective transistor drive circuit depending on an operation of the memory array; and
    a second voltage switch configured to select a voltage to be supplied to the second selective transistor drive circuit depending on the operation of the memory array, wherein
    a transistor constituting the first selective transistor drive circuit is different in structure from a transistor constituting the second selective transistor drive circuit.

2. The nonvolatile semiconductor memory device of claim 1, wherein
    during program operation of the memory array, a first voltage is applied to the first selective transistor group from the first voltage switch via the first selective transistor drive circuit, and a second voltage is applied to the second selective transistor group from the second voltage switch via the second selective transistor drive circuit, and
    during read operation of the memory array, a third voltage is applied to the first selective transistor group from the first voltage switch via the first selective transistor drive circuit, and a fourth voltage is applied to the second selective transistor group from the second voltage switch via the second selective transistor drive circuit.

3. The nonvolatile semiconductor memory device of claim 2, wherein
    the first voltage is supplied from a first power supply circuit, and the second voltage is supplied from a second power supply circuit.

4. The nonvolatile semiconductor memory device of claim 3, wherein the first power supply circuit and the second power supply circuit supply different voltages.

5. The nonvolatile semiconductor memory device of claim 2, wherein
the first or second voltage whichever is lower is supplied from a power supply circuit that supplies a voltage to be applied to the word line during the read operation.

6. The nonvolatile semiconductor memory device of claim 1, wherein
the transistor constituting the first selective transistor drive circuit is different in the thickness of a gate oxide film from the transistor constituting the second selective transistor drive circuit.

7. The nonvolatile semiconductor memory device of claim 1, wherein
the transistor constituting the first selective transistor drive circuit is different in the distance between a gate and a drain contact from the transistor constituting the second selective transistor drive circuit.

8. The nonvolatile semiconductor memory device of claim 1, wherein
the transistor constituting the first selective transistor drive circuit is different in gate length from the transistor constituting the second selective transistor drive circuit.

9. The nonvolatile semiconductor memory device of claim 1, wherein
the nonvolatile memory cell is a metal oxide nitride oxide silicon (MONOS) memory cell.

10. The nonvolatile semiconductor memory device of claim 9, wherein
in the MONOS memory cell, information is stored by injecting charge locally into a portion of the memory cell near a bit line, and one-bit information is stored using a portion of the memory cell near one of the first and second bit lines connected.

* * * * *